US007054223B2

(12) United States Patent
Takahashi et al.

(10) Patent No.: US 7,054,223 B2
(45) Date of Patent: May 30, 2006

(54) SEMICONDUCTOR MEMORY DEVICE

(75) Inventors: Hiroyuki Takahashi, Kanagawa (JP); Takuya Hirota, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/920,249

(22) Filed: Aug. 18, 2004

(65) Prior Publication Data
US 2005/0041520 A1 Feb. 24, 2005

(30) Foreign Application Priority Data
Aug. 22, 2003 (JP) .............................. 2003-298546

(51) Int. Cl.
*G11C 8/00* (2006.01)
(52) U.S. Cl. ...................... 365/233; 365/222; 365/191
(58) Field of Classification Search ................ 365/233, 365/232, 202, 222, 191
See application file for complete search history.

(56) References Cited
U.S. PATENT DOCUMENTS
6,208,577 B1 * 3/2001 Mullarkey .................. 365/222

| 6,636,449 | B1 * | 10/2003 | Matsuzaki | ................... 365/222 |
| 2003/0039163 | A1 * | 2/2003 | Leung | ........................ 365/222 |
| 2003/0072206 | A1 * | 4/2003 | Chen | .......................... 365/222 |
| 2004/0057315 | A1 * | 3/2004 | Jain | ........................... 365/222 |

OTHER PUBLICATIONS

Zensuke Matsuda. "System Memory Development Policy", NEC Device Technology International 2002, Searched on Jun. 28, 2003, No. 65, Internet <URL> "http://www.necel.com/japanese/banner/tech/77/DTJ77NSZ.pdf".

* cited by examiner

*Primary Examiner*—Richard Elms
*Assistant Examiner*—Dang T. Nguyen
(74) *Attorney, Agent, or Firm*—McGinn IP Law Group, PLLC

(57) ABSTRACT

A semiconductor memory device adapted for avoiding collision between the selection period of a word line for a refresh and the selection period of a word line for a read/write, comprises a cell array including a plurality of memory cells that require refreshing for retention of storage data and means for exercising control so that when a read/write request is input in a clock cycle following a clock cycle for performing a refresh operation, a read/write operation in the cell array is delayed by at least one clock cycle, and the read/write operation is started after completion of the refresh.

35 Claims, 12 Drawing Sheets

SEMICONDUCTOR MEMORY DEVICE

FIELD OF THE INVENTION

The present invention relates to a semiconductor memory device. More specifically, the invention relates to a semiconductor memory device having memory cells requiring refreshing for data retention.

BACKGROUND OF THE INVENTION

Recently, a semiconductor memory device that uses DRAM (dynamic access memory) cells as the memory cells, includes a self refresh function, and has a pin arrangement and interface, substantially compatible with an SRAM (static random access memory) has been developed and manufactured (refer to nonpatent document 1, for example). A clock-synchronous type high-speed SRAM of this type is employed for network devices, for example.

[Non-patent Document 1] Zensuke Matsuda, "System Memory Development Policy", NEC DEVICE TECHNOLOGY INTERNATIONAL 2002 No. 65, searched on Jun. 28, 2003, Internet <URL> "http://www.necel.com/japanese/banner/tech/77/DTJ77NSZ.pdf"

SUMMARY OF THE DISCLOSURE

When the DRAM cells are used in the cell array of the clock-synchronous type high-speed SRAM, a refresh might collide with a read/write access. A description will be given below with reference to a timing diagram shown in FIG. 9. Referring to FIG. 9, CLK denotes a clock signal for synchronization supplied from an outside to the memory, /ADV is a signal supplied to the memory from a CPU (or a controller) not shown, and is an address valid signal indicating that an address output from the CPU is effective (active at a low level), /CS is a chip select signal supplied to the memory, and Word indicates selected word lines in the cell array of the memory. In the following description, a mark "/" before the names of the signals, such as in the "/ADV" and "/CS", (which is indicated by "-" above the names of the signals in the drawing) indicates that the signals are active at a low level.

In an example in FIG. 9, a word line for a refresh is selected at a rising edge of the clock signal CLK at a time t2. A memory device is kept in a standby state (with the /CS being high) until a clock cycle that begins at the time t2. Then, an active (or a read/write) cycle is started at a time t3. A word line selected for the read/write is made to be at a high potential based on a one-shot pulse (a ROW enable signal to be described hereinafter) generated at the rising edge of the clock signal at the time t3. Referring to FIG. 9, time intervals designated by tS and tH, around the rising edge of the clock signal CLK for the signals /ADV and /CS at the time t3 respectively indicate the set up time and the hold time of registers (not shown) that sample the signals /ADV and /CS respectively at the rising edge of the clock signal CLK. The refresh address is supplied from a refresh address generation circuit not shown to an X decoder which decodes the X address, and the selected word line is driven to a high potential by a word driver circuit. As shown in FIG. 9, the period of selecting a word line for the refresh is set to be equal to or longer than a one clock cycle period. For this reason, when a refresh operation has been started in a clock cycle immediately before the start of an active cycle, the trailing edge of the period of selecting the word line for the refresh and the period of selecting a word line for the read/write in the subsequent clock cycle overlap each other.

When a configuration is adopted that controls waiting for issuance and execution of a read/write request for the memory from the CPU (or the controller) based on the presence or absence of refreshing on a DRAM cell, for example, so as to avoid overlapping of the selection period of a word line for a refresh and the selection period of a word line for a read/write described above, the memory device does not become SRAM-interface compatible.

Accordingly, it is an object of the present invention to provide a semiconductor memory device that avoids collision between the selection period of a word line for a refresh and the selection period of a word line for a read/write.

Another object of the present invention is to provide a semiconductor memory device that implements a high-speed operation while avoiding collision between a refresh and a read/write.

A still other object of the present invention is to provide an SRAM interface compatible semiconductor memory device that can simplify its configuration while achieving the above objects.

The above and other objects are attained by a semiconductor memory device in accordance with an aspect of the present invention including: a cell array including a plurality of memory cells, each requiring refreshing for retention of storage data; and a control circuit for performing control so that when a read/write request is made in a second clock cycle following a first clock cycle in which a refresh request has been made, a read/write operation in the cell array is delayed by at least one clock cycle and the read/write operation in the cell array is started after completion of a refresh operation.

A semiconductor memory device according to other aspect of the present invention includes: a cell array including a plurality of memory cells, each requiring refreshing for retention of storage data; and a control circuit for performing control so that when a control signal associated with a read/write operation transitions to a predetermined value in a first clock cycle in which a refresh request has been made, a read/write request is determined to be made in a second clock cycle following the first clock cycle, and the refreshing is cancelled. Then, when the read/write request is input in the second clock cycle, the read/write operation in the cell array is started.

A semiconductor memory device according to still other aspect of the present invention includes: a cell array including a plurality of memory cells, each requiring refreshing for retention of storage data; and a control circuit for performing control so that when a read/write request is made in a second clock cycle following a first clock cycle in which a refresh request has been made, time for performing the refreshing is reduced, a refreshing operation is completed, and a read/write operation in the cell array is started. In the present invention, after the refreshing is stopped, a refresh period is reduced.

The meritorious effects of the present invention are summarized as follows.

The present invention contributes to speeding up of an SRAM interface compatible semiconductor memory device having DRAM cells in its cell array, which can avoid collision between the selection period of a word line for a refresh and the selection period of a word line for a read/write.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
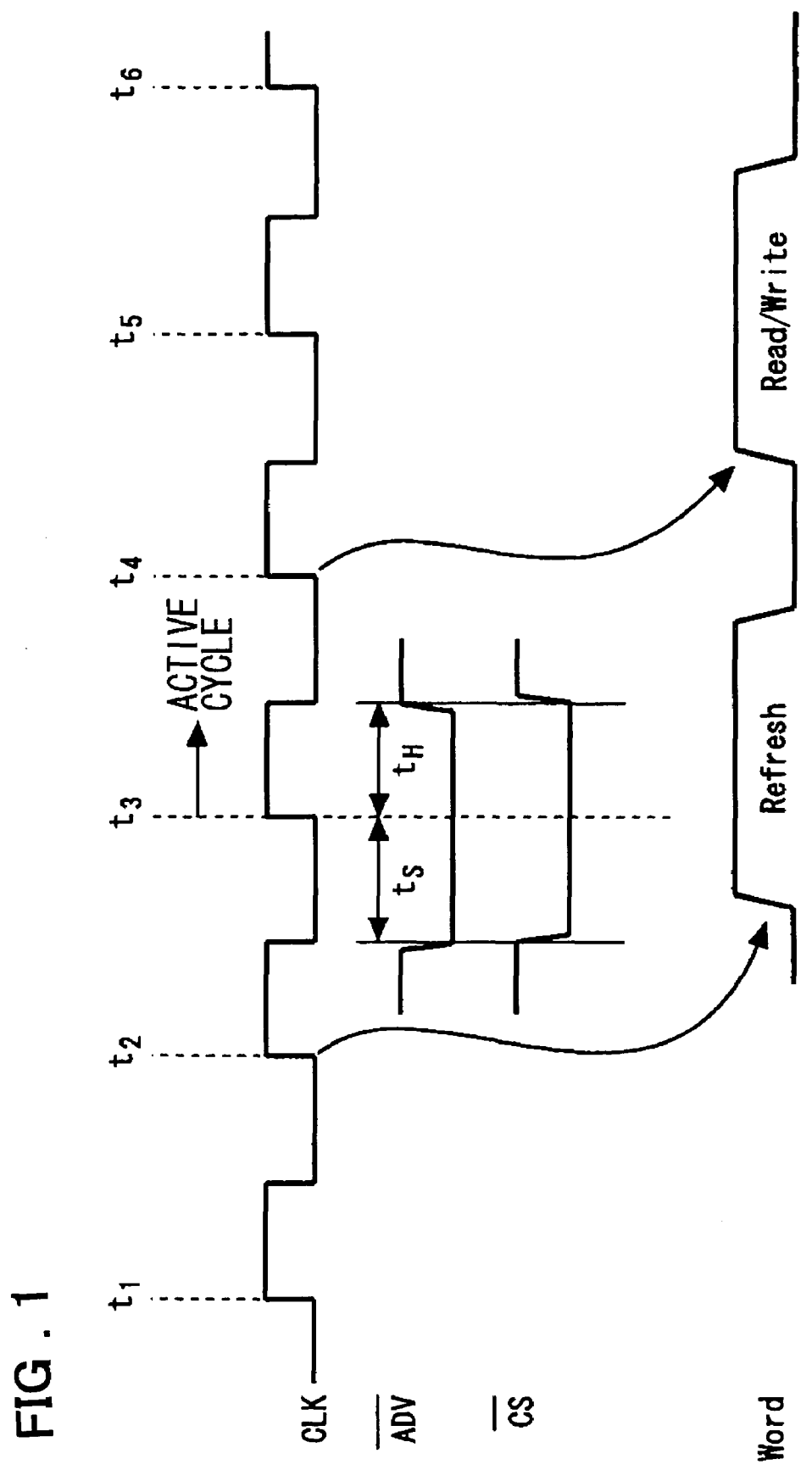
FIG. 1 is a diagram showing operation timing waveforms according to an embodiment of the present invention.

The preferred embodiments of the invention of the present invention will be described. FIG. 1 is a timing diagram for explaining the operation of a preferred embodiment of the present invention. Referring to FIG. 1, CLK indicates a clock signal for synchronization supplied from an outside to a memory, /ADV is a signal supplied to the memory from a CPU (or a controller) not shown, and is an address valid signal indicating that the output address is effective (active at a low level), /CS is a chip select signal supplied to the memory, and Word indicates a selected word line in the cell array of the memory. Meanwhile, the signals CLK and /ADV are compliant with an SRAM signal described in the nonpatent document 1 described above. Even if data input/output is delayed from address input (with the /ADV being low) (by two clocks, for example) and a read operation and a write operation are alternately performed, no dead cycle is present for a data bus. The efficiency of operations is achieved, so that a memory device can be made suitable for high speed operation.

Referring to FIG. 1, a word line for a refresh is selected at the rise of the clock signal CLK at a point in time t2. In this embodiment, the selection period of the word line for the refresh is set to be longer than a one clock cycle. The word line for the refresh is selected by an X decoder which decodes the refresh address supplied from a refresh address generation circuit not shown. The time intervals designated by tS and tH for signals /ADV and /CS, around the rising edge of the clock signal CLK at a time t3 respectively indicate the set up time and the hold time of registers that samples the signals /ADV and /CS at the rising edge of the clock signal CLK.

In an example shown in FIG. 1, control is so performed that while a refresh operation is performed at the point of the time 3 when the subsequent clock cycle is started, an active cycle (a read/write) from the time t3 is delayed by one clock cycle, and an access operation (the read/write operation) in the cell array is started at the rise of the clock signal at the next time t4. More specifically, a one-shot pulse signal (ROW enable signal) for defining the selection period of a word line for a read/write in the cell array is generated at the rise of the clock signal at the time t4 delayed by one clock cycle from the time 3.

For performing this control, there may be provided a selection circuit for receiving a signal for generating a ROW enable signal for activating a word line for a read/write and a signal obtained by delaying this signal by at least one clock by a register, The selection circuit selects and outputs the delayed signal output from the register when a control signal for controlling the refresh operation indicates a refresh, and selects and outputs the signal that is not delayed when the refresh is not performed. Alternatively, this control is implemented by supplying a clock as a gated clock to a register for sampling a read/write request. More specifically, it may be so configured that while the refresh operation is performed, the clock is not supplied to the register for sampling the read/write request, and the clock is supplied to the register during a period for performing an operation other than the refresh.

Depending on the length (pulse width) of the selection period of a word line for the refresh, the start of the read/write operation may be delayed by one clock cycle or longer. More specifically, referring to FIG. 1, the selected word line for the read/write may be brought to a high potential at the rise of the clock signal after the time t5. In this embodiment, the start of the read/write inside the cell array is delayed by one clock cycle or longer. Thus, though an access time increases by at least one clock cycle, refresh control (standby) with an outside is not required. SRAM interface compatibility is thereby maintained, so that system design is facilitated.

Figure 2:
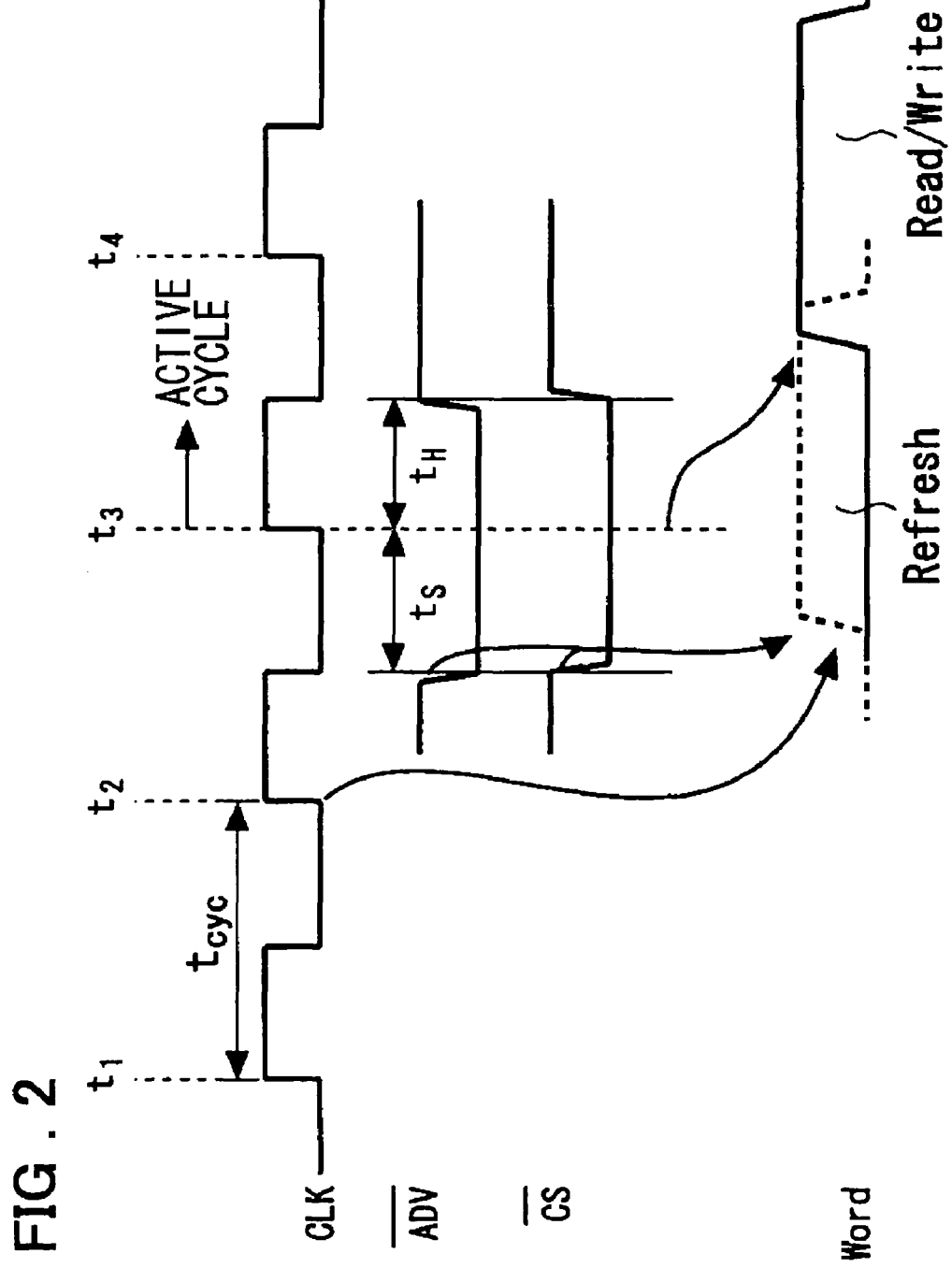
FIG. 2 is a diagram showing operation timing waveforms according to other embodiment of the present invention.

FIG. 2 is a diagram showing operation waveforms in another embodiment of the present invention. Referring to FIG. 2, when the refresh of the cell array is to be performed at the rise of the clock signal at the time t2 and the signal/ADV or the signal /CS transitions to the low level during the clock cycle starting at the time t2, the read/write request might become active at the rise of the clock signal at the next time t3. For this reason, in this embodiment, a request for the refresh is cancelled. That is, as shown in a broken line in FIG. 2, the word line for the refresh is not selected. According to the embodiment of the present invention, since the generation of a one-shot pulse signal for activating the word line for the refresh is cancelled, prolongation of the one-shot pulse signal or the like even to the subsequent clock cycle is avoided, so that a delay in the access time of the read/write operation can be reduced.

The above-mentioned control can be exercised by a circuit that receives the address valid signal /ADV and the memory chip select signal /CS, for performing control so that when the /ADV and the /CS are high, a signal for activating a word line for the refresh is output and when the address valid signal /ADV and the chip select signal /CS are low, the signal for activating the word line for the refresh is not activated. In this embodiment, responsive to the rise of the clock signal CLK at the time t3, the active cycle begins, so that the read/write is started. The refresh operation performed by a conventional art in a setup time tS for the address valid signal /ADV or the chip select signal /CS for defining the active cycle is controlled using the fall of the address valid signal /ADV or the chip select signal /CS. In this embodiment, the start of the refresh which is made within the setup time tS in the embodiment described before is deterred.

Figure 3:
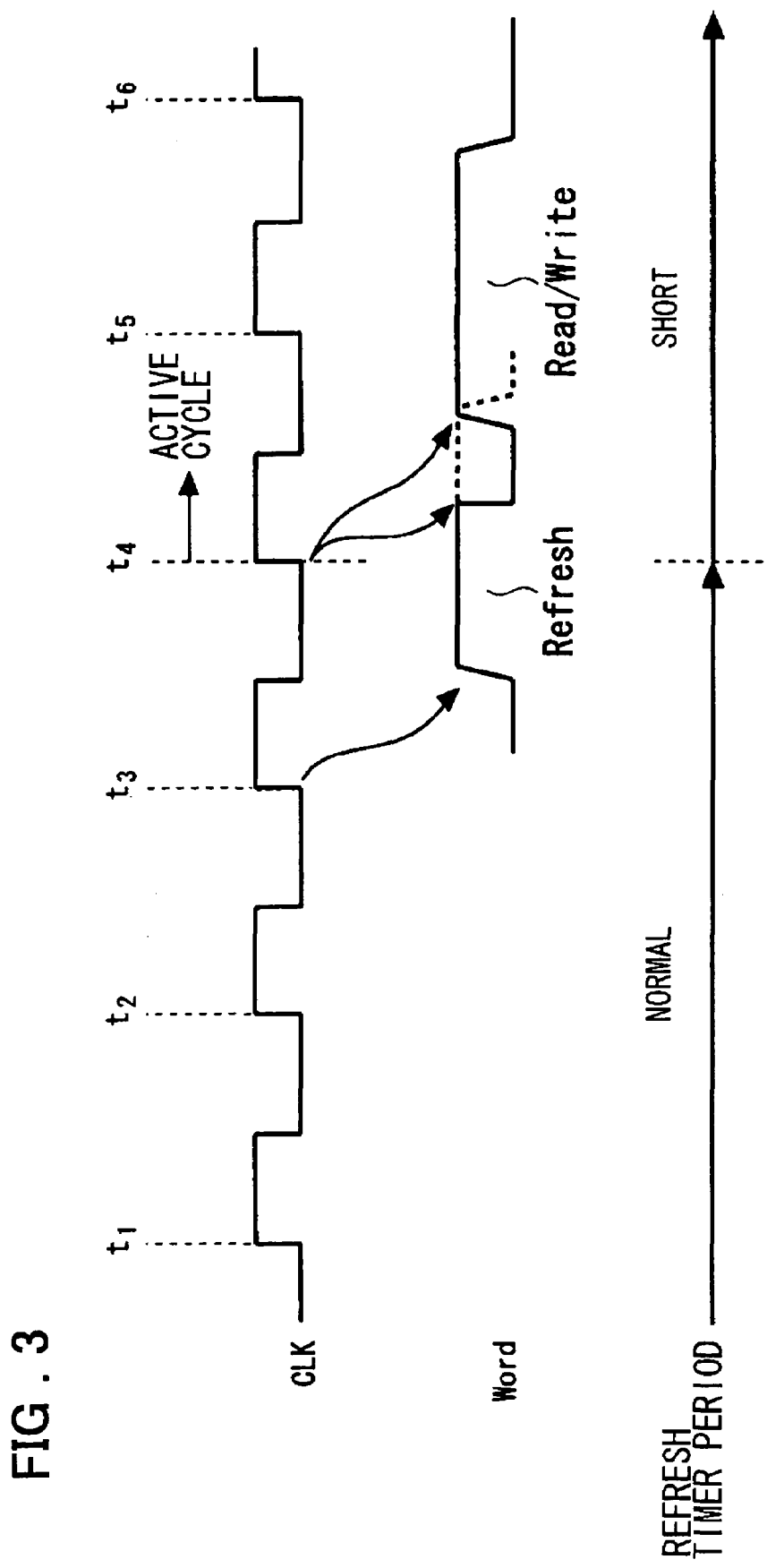
FIG. 3 is a diagram showing operating timing waveforms according to a still other embodiment of the present invention.

FIG. 3 is a diagram showing operation waveforms according to another embodiment of the present invention. Referring to FIG. 3, the refresh (the refresh operation being longer than one clock cycle) is performed in a clock cycle beginning at a time t, and the read/write request is input in a clock cycle beginning at the time t4. In this embodiment, the refresh operation is performed at the rise of the clock signal CLK at the time t3, and a selected word line for the refresh is forcibly made to be at a low potential so as not to be selected at the rise of the clock signal CLK at the subsequent time t4. The refresh is thereby stopped. That is, the latter end of a period for the refresh is cut, and the refresh is performed in a "shortened state".

Then, at the rise of the clock signal CLK at the time t4, a word line for the read/write is selected. The selection period of the word line for the shortened refresh and the selection period of the word line for the read/write do not overlap each other. Further, even in the case where the refresh is performed in the immediately preceding clock cycle, selection of the word line for the read/write is performed in the same manner as in the state where the refresh is not performed. That is, a delay due to the refresh does not occur.

When a refresh period is shortened, the refresh operation is sometimes stopped before a bit line potential is sufficiently amplified by a sense amplifier for reading data held in a memory cell connected to the word line for the refresh. In this case, a voltage to be restored in the storage capacitor of the selected memory cell (e.g. the voltage across terminals of the storage capacitor C of the memory cell in FIG. 4) sometimes becomes lower than the voltage restored in the normal refresh period. Since the amount of charge stored in the storage capacitor decreases, the data holding period of the cell caused by a leak current is reduced.

Accordingly, in this embodiment, control is performed so that after a cycle in which a refresh operation time has been reduced, the timeout period of a refresh timer for defining a refresh interval is reduced. When a word line selected in a cycle in which the refresh is reduced is a Word#3 in a configuration having (N+1) word lines constituted from Word #0 to Word #N, the refresh with the period of the refresh timer being shortened is performed for word lines word#4 to Word#N, Word#0, Word#1, and Word#2, until coming back to the original Word#3. If the normal refresh is performed for Word#3, the shortening of the refresh period is cancelled. The present invention will be described below in detail in connection with specific embodiments.

EMBODIMENTS

Figure 4:
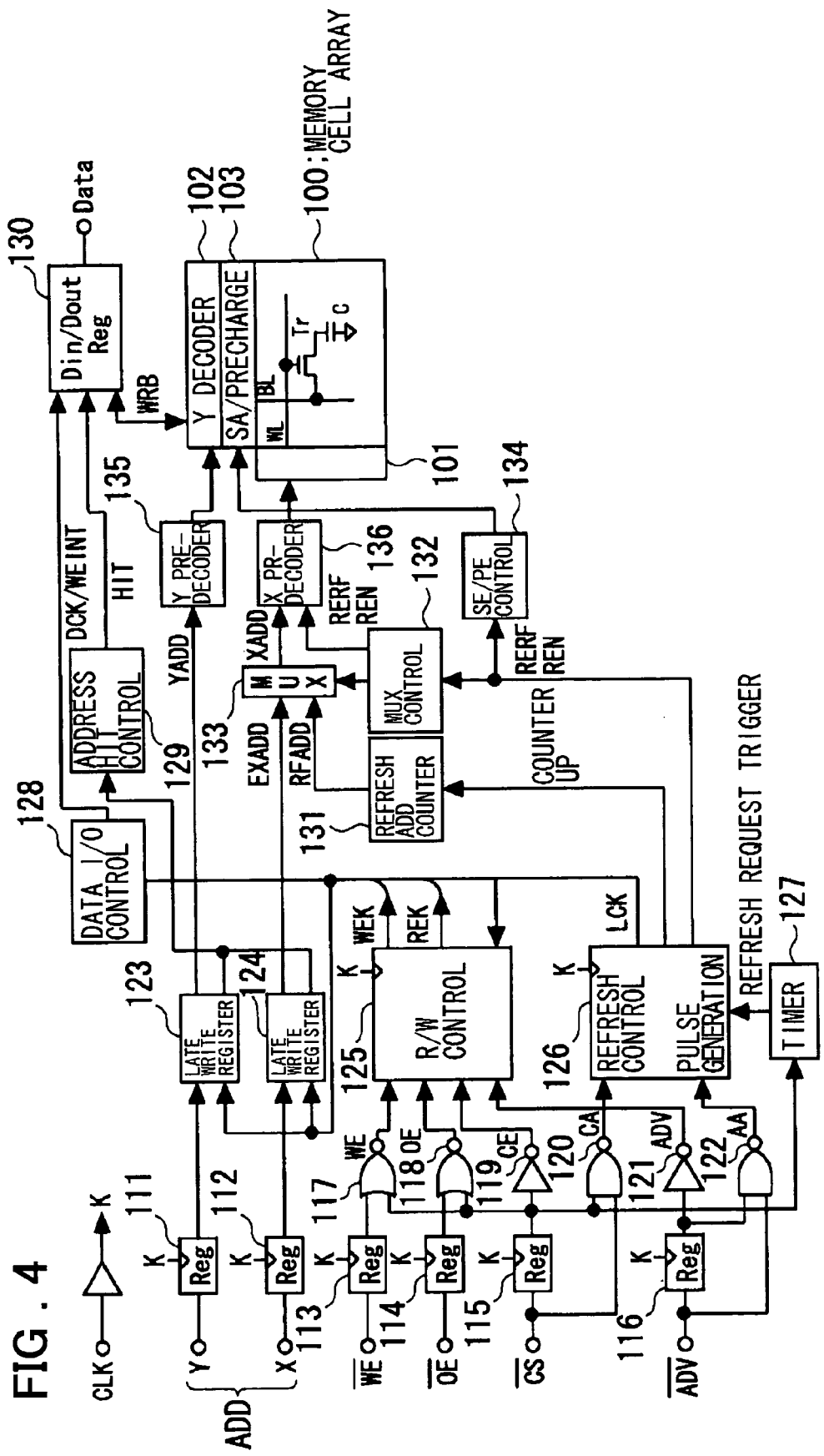
FIG. 4 is a diagram showing a memory configuration according to an embodiment of the present invention.

FIG. 4 is a diagram schematically showing an entire configuration of a memory device according to an embodiment of the present invention. Referring to FIG. 4, a memory cell array 100 includes DRAM cells provided at intersections between a plurality of word lines and a plurality of bit lines, in a matrix fashion. Further, an X decoder 101 for selecting a word line based on an X address, a Y decoder 102 for selecting a Y switch based on a Y address, a sense amplifier/precharge circuit 103 which includes a precharge circuit for precharging a bit line and a sense amplifier for reading a cell data from the bit line and for writing a data to a cell from the bit line are provided. For simplicity, FIG. 1 schematically shows one memory cell (having one capacitor per transistor) provided with a cell transistor Tr and a storage capacitor C, at the intersection between a word line WL and a bit line BL in the memory cell array 100.

An input address signal (a Y address and an X address) are supplied to a register 111 and a register 112 (address registers), respectively, and sampled using an internal clock signal K. The outputs of the registers 111 and 112 are sampled at late write registers 123 and 124, respectively, in synchronization with a latch control clock signal LCK to be described hereinafter. Each of the registers 111 and the late write registers 123 includes a registers for holding an access address having the bit width equal to that of the Y address and each of the registers 113 and the late write registers 124 includes a registers for holding an access address having the bit width equal to that of the X address. The internal clock signal K is the clock signal generated in the memory device based on the clock signal CLK supplied to the memory device from an outside.

The Y address output from the late write register 123 is supplied to a Y predecoder 135 as a memory access Y address YADD. The Y predecoder 135 decodes the Y addresses and generates a signal for selecting column switches (Y switches) in a unit of a plurality of columns (a block) to supply the so generated signal to a Y decoder 102. The Y decoder 102 decodes the signal from the Y predecoder 135, and generates a column selection signal for selecting one column switch, as a result of which a write read bus (WRB) is connected via the selected column switch to the sense amplifier.

The X address output from the late write register 124 is supplied to a multiplexer 133 as a memory access X address EXADD. The multiplexer 133 selects either of a row address RFADD from a refresh address counter 131 and the memory access X address EXADD by switching to supply the selected address to an X predecoder 136. The X predecoder 136 performs decoding the row (X) address in a unit of a plurality of address signals (a block), selects one word line among all word lines that belong to a plurality of subblocks for driving. In the example shown in FIG. 1, the memory cell array 100 is made up of a plurality of blocks. However in the case where the memory cell array 100 does not have the plurality of blocks or the like, the X predecoder 136 and the Y predecoder 135 may be omitted.

A register 113 samples a signal (a write enable signal /WE) input from a write enable terminal /WE at the rising edge of the internal clock signal K. The write enable signal /WE indicates a write at a low level and indicates a read at a high level.

A register 114 samples a signal (output enable signal /OE) input from an output enable terminal /OE at the rising edge of the internal clock signal K. When the output enable signal /OE is low, output of data read from a cell is permitted.

A register 115 samples a signal (chip select signal /CS) input from a chip select terminal /CS at the rising edge of the internal clock signal K. The chip select signal /CS indicates an active state at a low level, and indicates an inactive state at a high level.

A register 116 samples a signal (address valid signal /ADV) input from an address valid terminal /ADV at the rising edge of the internal clock signal K.

A NOR circuit 117 which receives the write enable signal /WE sampled by the register 113 based on the internal clock signal K and the chip select signal /CS sampled by the register 115 based on the internal clock signal K, outputs a write enable signal WE. When the input write enable signal /WE is active (at a low level) and the input chip select signal /CS is active (at a low level), the write enable signal WE in the active state (at a high level) is output from the NOR circuit 117.

A NOR circuit 118 which receives the output enable signal /OE sampled by the register 114 based on the internal clock signal K and the chip select signal /CS sampled by the register 115 based on the internal clock signal K, outputs an output enable signal OE. When the input output enable signal /OE is in the active state (at the low level) and the input chip select signal /CS is the active state (at the low level), the output enable signal WE in the active state (at the high level) is output from the NOR circuit 118.

A read/write (R/W) control circuit 125 that performs control over a read/write operation receives the write enable signal WE, output enable signal OE, a signal (chip enable signal) CE, obtained by inversion of the chip select signal /CS sampled by the register 115 using an inverter 119, and a signal ADV obtained by inversion of the address valid signal /ADV sampled by the register 116 using an inverter 121, decodes the input signals, and determines whether a read access or a write access has been made. The read/write control circuit 125 receives a latch control clock signal LCK from a refresh control pulse generation circuit 126 and outputs control signals WEK and REK that command data writing and data reading, respectively, in synchronization with the latch control clock signal LCK.

A data I/O control circuit 128 controls a data input/output register (Din/Dout Reg) 130. The data I/O control circuit 128 outputs a data sampling internal clock signal DCK and a data writing internal clock signal WEINT to the data input/output register 130, based on the output enable signal OE and the control signals WEK and REK that command data writing and data reading, respectively.

Further, in this embodiment, a NAND circuit 120 with its two input terminals connected to the output terminal of the register 115 and a terminal /CS is provided. A signal CA output from the NAND circuit 120 is supplied to the refresh control pulse generation circuit 126. The NAND circuit 120 outputs the low level when the output signal of the register 115 and the signal /CS are both high (in the inactive state). When either of the output signal of the register 115 and the signal /CS is low or both of the signals are low, the NAND circuit 120 outputs the high level as an output signal. When the NAND circuit 120 detects a change to the active state by either of the unsynchronized signal (signal from the terminal /CS) and the synchronized signal (output of the register 115), the NAND circuit 120 changes the value of its output signal.

A NAND circuit 122 with its two input terminals connected to the output terminal of the register 116 and the terminal /ADV is provided. An output AA of the NAND circuit 122 is supplied to the refresh control pulse generation circuit 126. When the output signal of the register 116 and the signal /ADV are both high (in the inactive state), the NAND circuit 122 outputs the low level. When either of the output signal of the register 115 and the signal /CS is low (in the active state) or both of the signals are low (both in the active state), the NAND circuit 122 outputs the high level as an output signal. When the NAND circuit 122 detects a change to the active state by either of the unsynchronized signal (signal from the terminal /ADV) and the synchronized signal (output of the register 116), the NAND circuit 122 also changes the value of its output signal.

A timer (refresh timer )127 is the timer for giving a trigger for activating the operation of refreshing a DRAM cell before the storage charge amount of data in the DRAM cell becomes a predetermined value or less by cell leakage. In this embodiment, the timer 127 receives the output of the register 115. The timer 127 exercises control so that when the signal /CS is high (at the time of nonselection, such as at the time of standby), a timer period is prolonged, and when the signal /CS is low for chip selection (at an active time), the timer period is shortened. When the timeout occurs in the timer 127, the timer 127 outputs a refresh request trigger signal. A known circuit configuration is employed for the timer 127. The timer 127 includes a ring oscillator that constitutes an oscillator, for example, a counter for frequency diving the output of the ring oscillator, and a circuit for outputting the refresh request trigger signal (such as a one-shot pulse signal or an edge signal) based on an overflow signal output from the counter. The ring oscillator is configured to feed back the output of an inverter at the last stage of an odd number of inverters connected in cascade to the input of the inverter at the first stage, and has a current source of a current value adjusting type between a power source and the inverters. By adjusting the current that flows through the inverters, an oscillating frequency is varied. The timer 127 may include a known cell leak monitor circuit for detecting leakage current of a dummy cell and may adjust the output period of the timer 127 which is variable, according to the leakage monitored.

The refresh control pulse generation circuit 126 is the circuit in which a refresh control circuit and a pulse generation circuit for outputting a pulse signal that defines the operation timing of the X decoder are combined into one circuit. The refresh control pulse generation circuit 126 generates the latch control clock signal LCK when the signal CA changes from a low level to a high level and the signal AA changes from a low level to a high level (when a read/write access address is effective), and supplies the latch control clock signal LCK to a read/write control circuit 125 and late write registers 123 and 124.

When the signal CA and the signal AA change to the high level (when the read/write access address is effective), the refresh control pulse generation circuit 126 also generates a ROW enable normal signal REN, which is the one-shot pulse signal defining the selection period of a word line for a read/write during an normal operation.

The refresh control pulse generation circuit 126 receives the refresh request trigger signal from the timer 127, and also outputs a ROW enable refresh signal RERF, which is the one-shot pulse signal defining the selection period of a word line for a refresh and outputs a count up signal to the refresh address counter 131.

The refresh address counter 131 receives the count up signal from the refresh control pulse generation circuit 126, counts up a count value one by one, and outputs the counter value to the multiplexer 133 as the refresh address RFADD. The refresh address counter 131 has the same bit width as that of the X address XADD (row address).

The multiplexer 133 that receives the output EXADD (execution address) of the late write register 124 and the refresh address RFADD from the refresh address counter 131 selects the execution address EXADD when a read/write operation is performed and selects the refresh address RFADD when a refresh is performed.

A multiplexer control circuit 132 receives the ROW enable normal signal REN and the ROW enable refresh signal RERF output from the refresh control pulse generation circuit 126, outputs a selection control signal for making selection between the execution address EXADD and the refresh address RFADD, and supplies the one-shot pulse signal (the ROW enable normal signal REN or the ROW enable refresh signal RERF) to the X predecoder 136.

The X predecoder 136 outputs the decoded signal during the period defined by the one-shot pulse signal supplied thereto.

A SE/PE control circuit 134 receives the one-shot pulse signal (ROW enable signal) REN or RERF from the refresh control pulse generation circuit 126 and generates signals (a sense amplifier activation signal and a precharge control signal, not shown) for activating a sense amplifier and a precharge circuit, respectively, so that the sense amplifier and the precharge circuit are activated, respectively. When the precharge circuit of the SA/Precharge circuit 103 is activated, the precharge circuit precharges a bit line to a predetermined potential (such as a half of the power supply potential). When the sense amplifier is activated, the sense amplifier receives and amplifies the potential at the bit line to which the memory cell specified by the access address is connected, to output the amplified signal to a write/read bus WRB. Alternatively, the sense amplifier receives write data signal supplied to the write/read bus WRB and writes the write data to the selected memory cell through the bit line.

An address hit control circuit 129 determines whether two consecutive access addresses match or not. When an address for a write access matches the address for a read access in the next cycle, the address hit control circuit 129 performs control so that write data which is held in the data input register 130 and has not yet been written to a memory cell yet is output as readout data. More specifically, when a write request is made in a cycle, write data is sampled by the data input (Din) register 130 once. Then, the write data sampled by the data input register is written to the memory cell array 100 in a cycle for which the write request has been made next. That is, the write data given immediately before the write request is made is output onto the write/read bus WRB from the data input register 130. On contrast therewith, when a read operation is performed, if a mishit in addresses has been determined by the address hit control circuit 129, the data output (Dout) register 130 samples read data on the write/read bus WRB. If a hit in addresses has been determined by the address hit control circuit 129, write data that is held in the data input register 130 and has not yet been written to a memory cell yet is set in the data output register 130 and output as read data.

Figure 5:
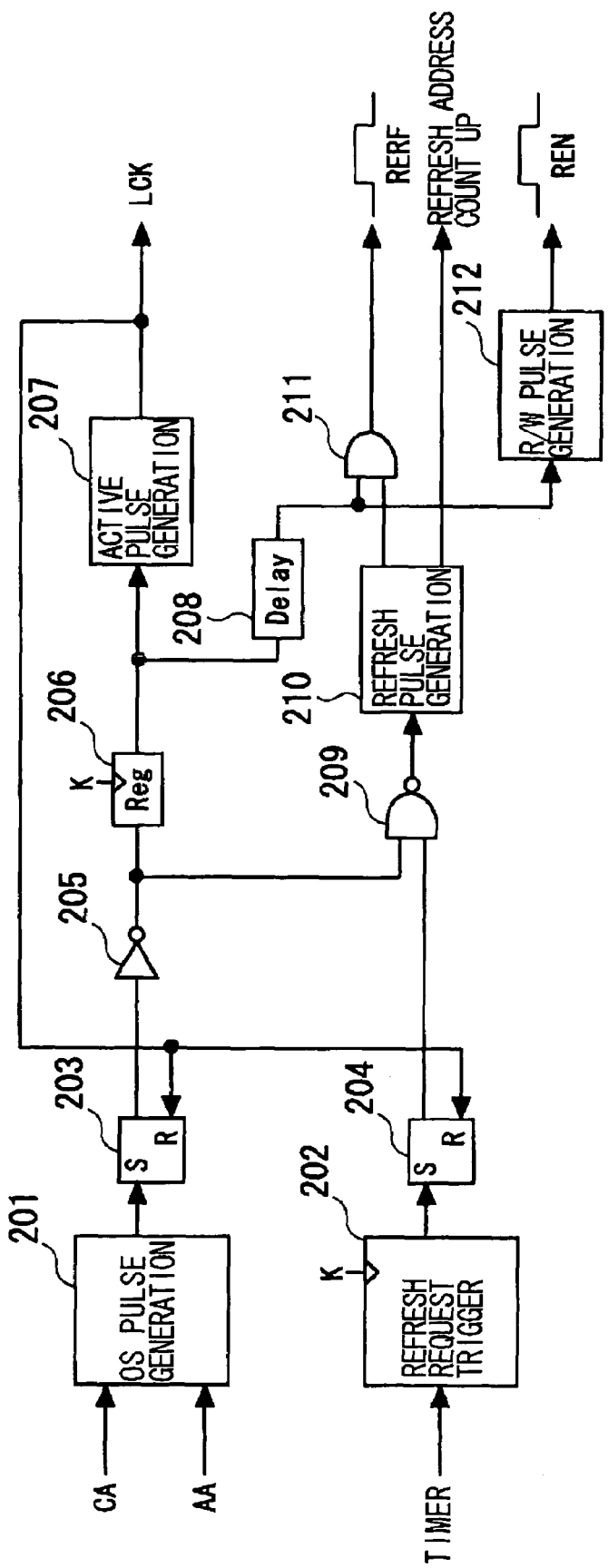
FIG. 5 is a diagram showing a configuration of a refresh control pulse generation circuit according to the embodiment of the present invention.

FIG. 5 is a diagram showing a configuration example of the refresh control pulse generation circuit 126. Referring to FIG. 5, this refresh control pulse generation circuit 126 includes a one-shot pulse generation circuit 201 for generating a one-shot pulse responsive to the rises of the CA signal and the AA signal to the high level, an SR flip-flop 203 which is set on receipt of the one-shot pulse output from the one-shot pulse generation circuit 201 at a set terminal thereof, an inverter 205 for inverting the output of the SR flip-flop 203, a register 206 for sampling the output of the inverter 205 in response to the internal clock signal K, and an active pulse generation circuit 207 for generating the one-shot pulse signal (latch timing control signal) LCK in response to the falling transition of the output of the register 206. The SR flip-flop 203 is reset on receipt of the pulse signal (latch timing control signal) LCK output from the active pulse generation circuit 207 at a reset terminal thereof.

The refresh control pulse generation circuit 126 further includes a refresh request trigger circuit 202, an SR flip-flop 204, a NAND circuit 209, a refresh pulse generation circuit 210, a delay circuit 208, an AND circuit 211, and an R/W pulse generation circuit 212. The fresh request trigger circuit 202 samples the refresh request trigger signal from the timer 127 in response to the internal clock signal K. The SR flip-flop 204 receives the signal at a high level output from the refresh request trigger circuit 202 at a set terminal thereof to be set. The NAND circuit 209 receives the output signal of the SR flip-flop 204 and the output signal of the inverter 205. The refresh pulse generation circuit 210 generates a refresh pulse at the fall of the output signal of the NAND circuit 209. The delay circuit 208 delays the output signal of the register 206. The AND circuit 211 receives the output signal of the refresh pulse generation circuit 210 and the output of the delay circuit 208 and outputs the ROW enable refresh signal RERF for defining the selection period of a word line for a refresh. The R/W pulse generation circuit 212 receives the output of the delay circuit 208 and generates the ROW enable normal signal REN for defining the selection period of a word line for a read/write. An operation of the circuit in FIG. 5 will be described.

When the CA signal or the AA signal is low (the signal /ADV at a high level indicates that the access address is not valid, while the signal /CS at a high level indicates the chip is not selected), the output of the SR flip-flop 203 is made low, and the high level is fed to an input terminal of the NAND circuit 209 through the inverter 205.

When the refresh request trigger signal is supplied to the refresh request trigger circuit 202 from the timer 127, the refresh request trigger circuit 202 generates a trigger signal (such as the one-shot pulse signal), and the output of the SR flip-flop 204 is set to a high level. In response to a change in the output of the SR flip-flop 204 to the high level, the output of the NAND circuit 209 (to one input terminal of which the high level is supplied from the inverter 205) falls from the high level to the low level, and the refresh pulse generation circuit 210 generates a one-shot pulse with the falling edge of the output of the NAND circuit 209 used as a trigger. The one-shot pulse from the refresh pulse generation circuit 210 is supplied to the other input terminal of the AND circuit 211 that receives the output signal of the delay circuit 208 (at a high level in this case) at its one input terminal, and the one-shot pulse (ROW enable refresh signal RERF) for defining the selection period of a word line for a refresh is output from the AND circuit 211. In this case (where the access address is invalid or the chip is not selected), the ROW enable normal signal REN for a read/write is fixed at a low level. That is, when the access address is invalid or the chip is not selected, a refresh operation is performed based on a refresh address from the refresh address counter 131. Meanwhile, the selection period of a word line for a refresh is set to be longer than one clock.

On the other hand, as shown in FIG. 2, for example, when the signals /ADV and /CS change from the high level to the low level and the CA signal and the AA signal changes from the low level to the high level (with the /ADV and the/CS kept low), in the period after a time t2 of starting a clock cycle for which a refresh request has been made and before a time t3 of starting the subsequent clock cycle, the output of the SR flip-flop 203 which has received the one-shot pulse at its set terminal from the one-shot pulse generation circuit 201, is set to a high level, so that the output of the inverter 205 goes low.

At this point, the output of the NAND circuit 209 that inputs the output of the inverter 205 (at a low level) in its one input terminal is fixed at a high level irrespective of the output value of the SR flip-flop 204. Thus, the refresh pulse generation circuit 210 does not generate the one-shot pulse even if the SR flip-flop 204 is set in response to the refresh request trigger signal. This control corresponds to the embodiment described with reference to FIG. 2. That is, the control shown in FIG. 2 described above is mainly exercised by the NAND circuit 209 provided in front of the refresh pulse generation circuit 210 that outputs the one-shot pulse signal based on the refresh request trigger signal, in FIG. 5.

The register 206 samples the output signal of the inverter 205 (at a low level) at the rise of the internal clock signal K corresponding to the rise of the clock signal CLK at the time t3.

The output of the register 206 is delayed by a predetermined time by the delay circuit 208, and the read/write pulse generation circuit 212 generates a one-shot pulse at the fall of the signal output from the delay circuit 208, and outputs the one-shot pulse as the ROW enable normal signal REN for a read/write.

In response to the transition from the high level to the low level of the output of the register 206, the active pulse generation circuit 207 outputs a one-shot pulse signal (latch control clock signal) LCK. This latch control clock signal is supplied to the late write registers 123 and 124 in FIG. 4 as latch timing signals for the late write of the address signal. Upon receipt of the rising pulse signal LCK, output from the active pulse generation circuit 207, at reset terminals thereof, the SR flip-flops 203 and 204 are reset, so that the output of the SR flip-flop 203 falls from the high level to the low level. The output of the inverter 205, receiving the output signal of the SR flip-flop 203, which has fallen, rises from the low level to the high level.

In this embodiment, when the signals /ADV and /CS have transitioned to the low level in a clock cycle for which a refresh request has been made, the one-shot pulse for the refresh is not generated. Further, the read/write pulse generation circuit 212 generates the one-shot pulse at the fall of the signal output from the delay circuit 208, and the AND circuit 211 secures that the ROW enable normal signal REN does not overlap with the ROW enable refresh signal RERF.

Output of the one-shot pulse generation circuit 201 is performed asynchronously based on the transitions of the CA signal and the AA signal to the high level. When the timing of transition of the output of the SR flip-flop 203 to the high level (indicated by tS in FIG. 2) is shorter than the set up time of the register 206 (time in which a data signal at a data input terminal of the register 206 must be stable before the rising edge of the internal clock signal k so as to correctly sample data), it sometimes happens that the register 206 cannot sample the transition of the output of the SR flip-flop 203 to the high level, and accordingly the transition of the output of the inverter 205 from the high level to the low level at the rise of the internal clock signal K that corresponds to the clock signal CLK at the time t3. In this case, the internal clock signal k may be delayed in order for the register 206 to perform sampling. The amount of delay of the delay circuit 208 in FIG. 5 is set to the time from the rise of the clock signal CLK at the time t3 in FIG. 2 to generation of the one shot pulse (REN) for activating a selected word line, for example.

Referring to FIG. 5, depending on the timing of transition of the signals /CS and /AVD in FIG. 2 to the low level, the output of the NAND circuit 209 might not be fixed at a high level due to the delay in the transition of the CA signal and the AA signal to the high level and the transition of the output of the inverter 205 to the low level. Further, due to the transition of the output of the SR flip-flop 204, the one shot pulse might be generated by the refresh pulse generation circuit 210. In this case, the output of the register 206 transitions to the low level at the timing of the time t3 in FIG. 2. Then, after the time of delay by the delay circuit 208, one input terminal of the AND circuit 211 is made to go low, so that the ROW enable refresh signal RERF is set to the low level.

Figure 6:
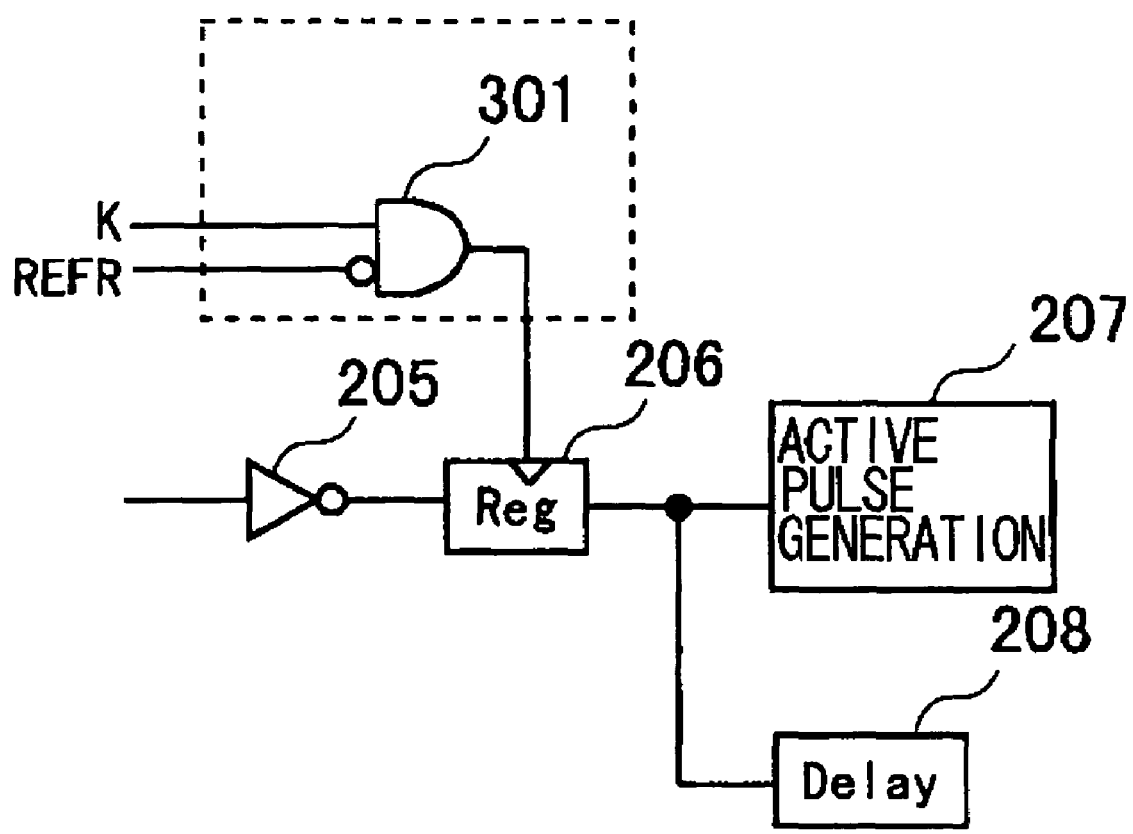
FIG. 6 is a diagram showing an example of a refresh control pulse generation circuit in an embodiment of the present invention.
Figure 7:
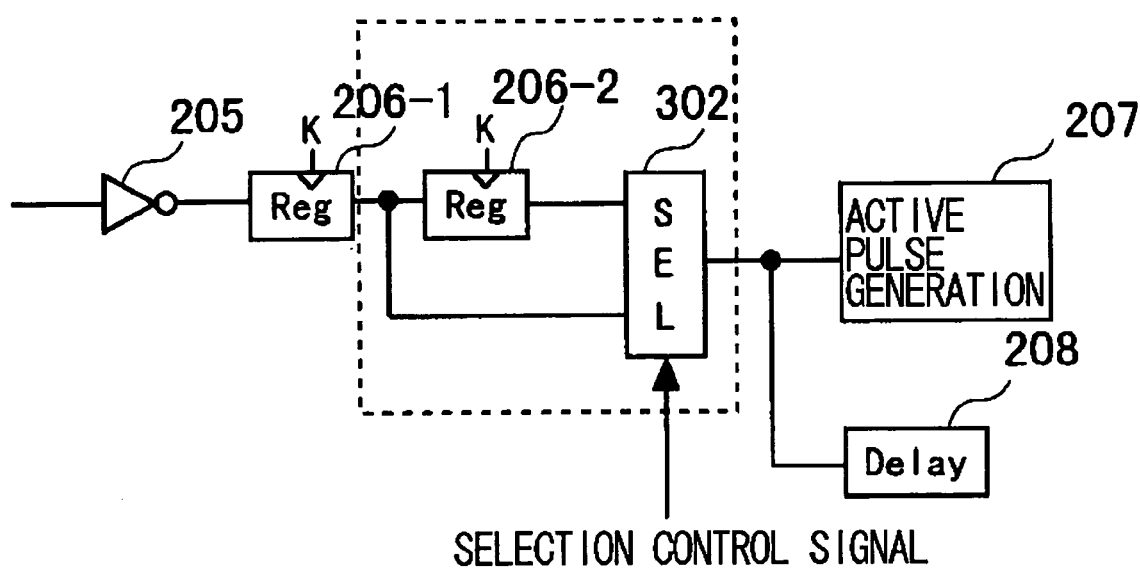
FIG. 7 is a diagram showing other example of a refresh control pulse generation circuit in an embodiment of the present invention.

Next, control of the embodiment shown in FIG. 1 will be described. FIGS. 6 and 7 show additional parts (indicated by broken lines) to the circuit illustrated in FIG. 5. The refresh control pulse generation circuit 126 illustrated in FIG. 5 may include an AND circuit 301 connected to the clock input terminal of the register 206, which receives the internal clock signal K and the inverted signal of the ROW enable refresh signal RERF output from the AND circuit 211, as shown in FIG. 6, for example. Then, the AND circuit may be so configured that when the RERF signal is high, transmission of the internal clock signal K to the register 206 is inhibited and when the RERF signal is low, the internal clock signal K is supplied to the register 206. This embodiment may also be so configured that the output of the SR flip-flop 204 is supplied to the refresh pulse generation circuit 210 without provision of the NAND circuit 209 in FIG. 5.

As shown in FIG. 1, the RERF signal is made to be high at the time t3 of starting the clock cycle subsequent to the clock cycle in which a refresh request has been made, and the internal clock signal K is not supplied to the register 206. Accordingly, the register 206 does not sample the signal from the SR flip-flop 203 at a high level (thus the output of the inverter 205 at a low level). Then, the internal clock signal K that corresponds to the clock signal at a time t4 after the RERF signal has gone low is supplied to the register 206. The register 206 samples the output of the inverter 205 at a low level and changes its output from the high level to the low level. The signal REN is output at the falling edge of the signal delayed through the delay circuit 208. That is, a read/write operation is started, being delayed by one clock cycle.

Alternatively, as shown in FIG. 7, the refresh control pulse generation circuit 126 may include two stages of registers 206-1 and 206-2 for sampling data in response to the internal clock signal K and a selector 302 for receiving the output of the first register 206-1 and the output of the second register 206-2. Then, the output of the selector 302 may be supplied to the active pulse generation circuit 207 and the delay circuit 208.

The selector 302 uses the signal indicating that a refresh operation is being executed (such as the output of the SR flip-flop 204) as a selection signal. Then, when an active cycle is started while a refresh is performed, the selector 302 selects the output of the second register 206-2, for output. Incidentally, in this embodiment, the NAND circuit 209 in FIG. 5 is not provided, and the output of the SR flip-flop 204 is input to the refresh pulse generation circuit 210.

Figure 8:
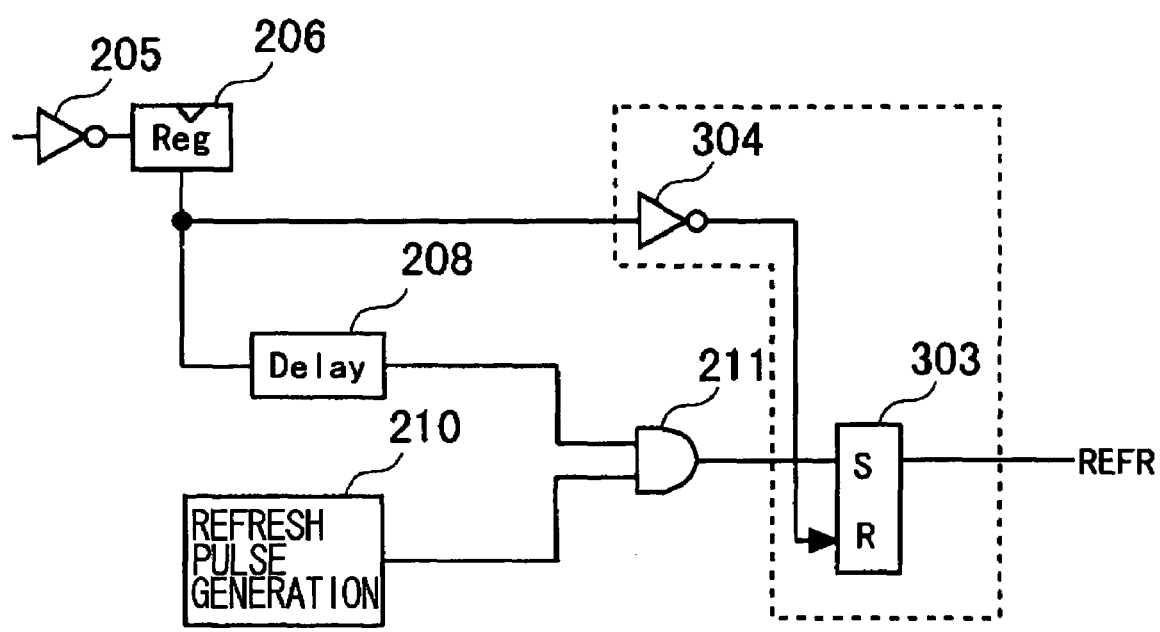
FIG. 8 is a diagram showing still other example of a refresh control pulse generation circuit in an embodiment of the present invention.
Figure 9:
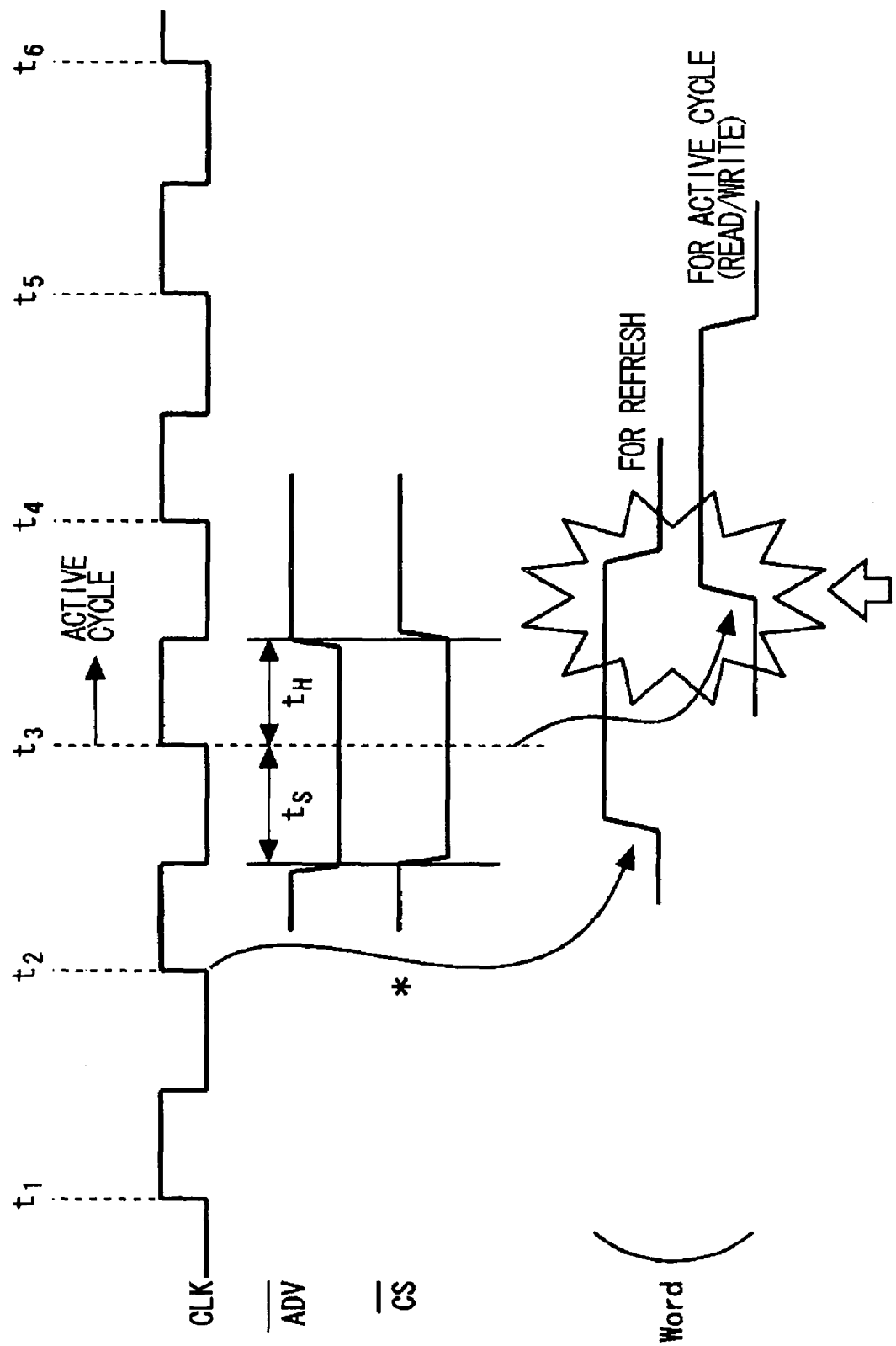
FIG. 9 is a diagram showing a state where the selection period of a word line for a refresh collides with the selection period of a word line for a read/write.

FIG. 8 is a diagram showing a modified part (enclosed by a dotted line) of the configuration of the circuit shown in FIG. 5. Control shown in FIG. 3 is performed in the refresh control pulse generation circuit 126 in which an SR flip-flop 303, for example, is provided in the subsequent stage of the AND circuit 211, as shown in FIG. 8. The output of the SR flip-flop 303 is set to a high level according to the output of the AND circuit 211 at a high level and is reset to a low level when the signal obtained by inversion of the output of the register 206 (that has fallen to the low level) using the inverter 304 is at a high level. At the fall of the output signal of the register 206 to a low level in response to the rise of the clock signal at the time t4 in FIG. 3, the SR flip-flop 303 is reset. That is, the ROW enable refresh signal RERF is forcibly made to be low at the rise of the clock signal at the time t4 in FIG. 3, so that the time of a refresh operation is shortened. Then, the ROW enable normal signal REN is output based on the signal obtained by delaying the output of the register 206 that has fallen to the low level using the delay circuit 208, so that a word line for a read/write is selected. In this case, the delay circuit 208 defines the interval from the time when a word line for the refresh in FIG. 3 is changed from the selected state to the nonselected state to the time when the word line for the read/write is selected.

In this embodiment, as already described with reference to FIG. 3, after the clock cycle that has shortened the time of the refresh operation, the timer 127 in FIG. 4 is controlled so that the output interval of the refresh request trigger signal defining the refresh interval is shortened. In this case, in addition to the chip select signal /CS sampled by the register 115, a signal (not shown) indicating that the refresh operation has been shortened is supplied to the timer 127 in FIG. 4. The timer 127 shortens the output interval of the refresh request trigger signal by increasing a driving current supplied to the inverter of the ring oscillator that constitutes the oscillator, for example, thereby increasing its oscillation frequency. The output interval of the refresh request trigger signal is shortened until refreshing has made its round in all row addresses, for example. Alternatively, in the counter for frequency dividing the output of the oscillator in the timer 127, by changing the bit for outputting the refresh request trigger signal from the MSB(most significant bit) to a bit in the position lower by one digit, for example, the output interval of the refresh request trigger signal is shortened to a half. By the way, in this embodiment, the NAND circuit 209 in FIG. 5 may be omitted, and the output signal of the SR flip-flop 204 may be input to the refresh pulse generation circuit 210.

Figure 10:
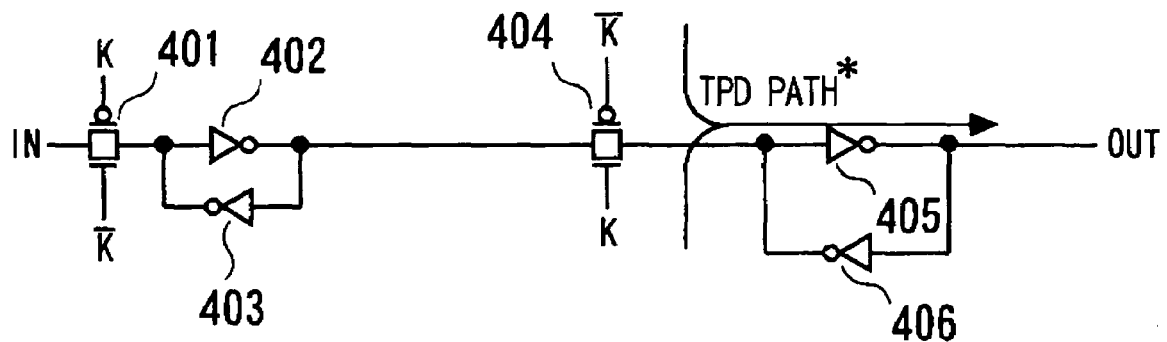
FIG. 10 is a diagram showing a configuration example of a register.
Figure 11:
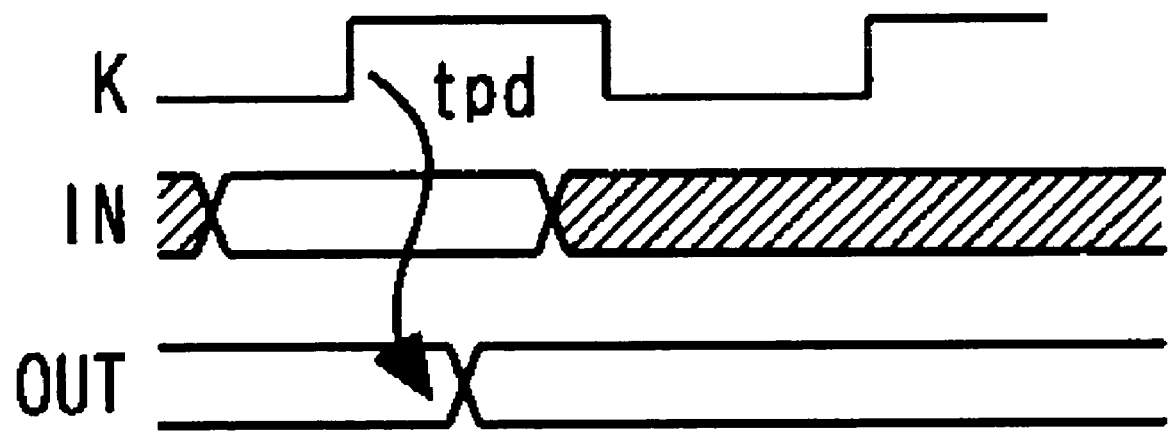
FIG. 11 is a diagram for explaining a timing operation of the register in FIG. 10.

Next, still another embodiment of the present invention will be described. FIGS. 10 and 11 are diagrams showing one known circuit configuration example of a register for sampling and outputting an input signal IN in response to the internal clock signal K. FIG. 11 is a timing diagram for explaining an operation of the register in FIG. 10. The register shown in FIG. 10 is a known edge trigger type register used as various registers 111 to 116 in FIG. 4. More specifically, this register is constituted from two latch circuits that includes a first transfer gate 401 and a first flip-flop, and a second transfer gate 404 and a second flip-flop, respectively. The first transfer gate 401 is constituted from a p-channel MOS transistor for inputting the internal clock signal K at its gate and an n-channel MOS transistor for inputting the complementary signal /K of the internal clock signal K at its gate, (which will be referred to as a "CMOS transfer gate"). The first flip-flop is constituted from inverters 402 and 403 with their inputs and outputs mutually connected. The second transfer gate 404 is constituted from an n-channel MOS transistor for inputting the internal clock signal K at its gate and a p-channel MOS transistor for inputting the complementary signal /K of the internal clock signal K at its gate. The second flip-flop is constituted from inverters 405 and 406 with their inputs and outputs mutually connected. As its operation, when the internal clock signal K is low, the first and second transfer gates 401 and 404 are turned on and off, respectively, and the value held in the second flip-flop is output to an output terminal OUT. When the internal clock signal K is high, the first and second transfer gates 401 and 404 are turned off and on, respectively, and the value obtained by inverting the output of the inverter 402 using the inverter 405 is output to the output terminal OUT. This output value is held in the second flip-flop. In the circuit configuration shown in FIG. 10, a threshold voltage Vth of transistors constituting the transfer gates 401 and 404, and the inverters 402, 403, 405, and 406 is set to an ordinary threshold value. Since the inverters 403 and 406 are the ones for holding data, smaller current driving capability of the inverters 403 and 406 (thus, a gate width W, or a W/L ratio, wherein L indicates a gate length) suffices, compared with that of the inverter 405 for driving. The inverters 403 and 406 are also referred to as "weak inverters". In FIG. 11, in the register shown in FIG. 10, a propagation delay time from the rising edge of the internal clock signal K to transition of an output signal OUT is indicated by tpd.

In order to reduce this propagation delay time tpd, a path for the tpd such as the propagation path between the transfer gate 404 and the inverter 405 in FIG. 10, for example, needs to be sped up. Then, in a synchronous type semiconductor storage device, it is necessary to make paths for the clock signal CLK and the internal clock signal, a row system, and a data output faster. That is, faster operations of the registers 111 and 112 in FIG. 4 become necessary.

Figure 12A:
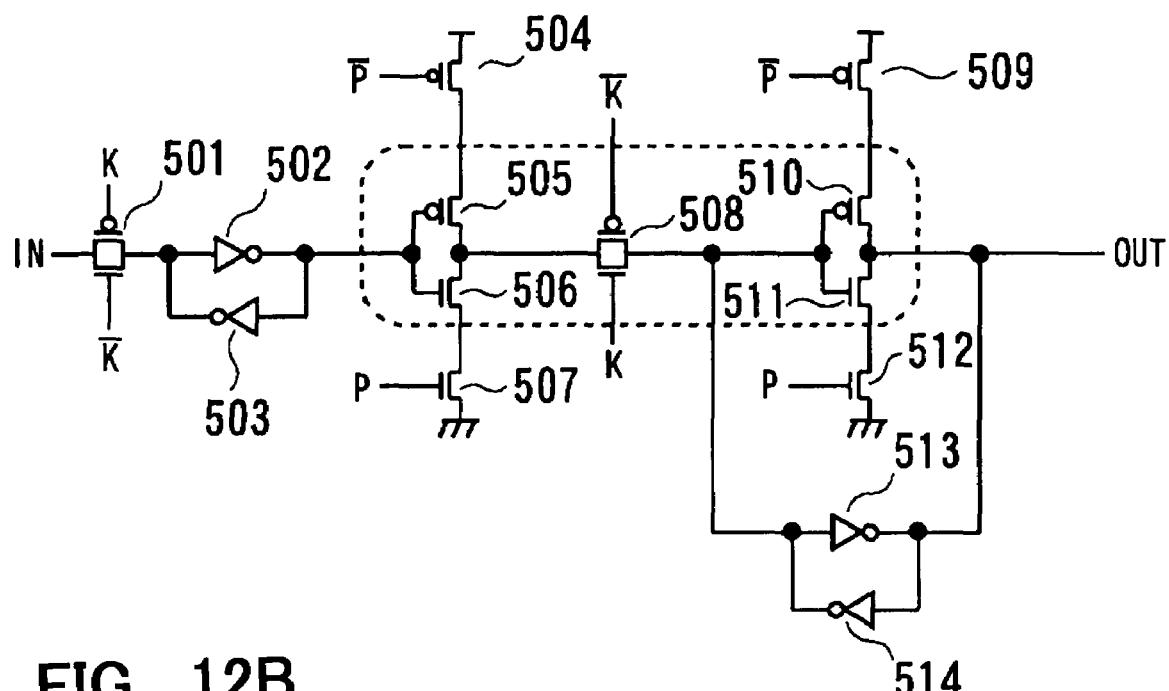
FIG. 12A is a diagram showing a configuration example of a register according to an embodiment of the present invention.

FIG. 12A is a diagram showing a configuration example of the registers 111 and 112 (refer to FIG. 4) according to this embodiment, for achieving a high speed operation of the synchronous type semiconductor memory device. For the registers 111 and 112 in FIG. 4, configurations shown in FIG. 12A corresponding in number to the line number of input address signals are provided in parallel. Referring to FIG. 12A, this register is constituted from a first transfer gate 501 and a first flip-flop, and a second transfer gate 508 and a second flip-flop, respectively. The first transfer gate 501 is constituted from a p-channel MOS transistor which receives the internal clock signal K at its gate and an n-channel MOS transistor which receives the complementary signal /K of the internal clock signal K at its gate. The first flip-flop is constituted from inverters 502 and 503 with their inputs and outputs are mutually connected. The second transfer gate 508 is constituted from an n-channel MOS transistor for inputting the internal clock signal K at its gate and a p-channel MOS transistor for inputting the complementary signal /K of the internal clock signal K at its gate. The second flip-flop is constituted from inverters 513 and 514 with their inputs and outputs are mutually connected. A first clocked inverter is included between the first flip-flop (formed of inverters 502 and 503) and the second transfer gate 508, and a second clocked inverter is included between the second transfer gate 508 and the output terminal OUT in parallel with the inverter 513.

The first clocked inverter includes n-channel MOS transistors 506 and 507 and p-channel MOS transistors 504 and 505. The source of the p-channel MOS transistor 504 is connected to a power supply VDD, and a complementary signal /P of a control signal P is supplied to the gate of the p-channel MOS transistor 504. The source of the n-channel transistor 507 is connected to ground, and the control signal P is supplied to the gate of the n-channel MOS transistor 507. The source of the p-channel MOS transistor 505 is connected to the drain of the p-channel MOS transistor 504. The source of the n-channel MOS transistor 506 is connected to the drain of the n-channel MOS transistor 507. The gates of the p-channel MOS transistor 505 and the n-channel MOS transistor 506 are connected in common to the output of the first flip-flop (output of the inverter 502). The drains of the p-channel MOS transistor 505 and the n-channel MOS transistor 506 are connected in common to the second transfer gate 508. The second clocked inverter includes n-channel MOS transistors 512 and 511 and p-channel MOS transistors 509 and 510. The source of the p-channel MOS transistor 509 is connected to the power supply VDD and the complementary signal /P of the control signal P is supplied to the gate of the p-channel MOS transistor 509. The source of the n-channel MOS transistor 512 is connected to ground, and the control signal P is input to the gate of the n-channel MOS transistor 512. The source of the p-channel MOS transistor 510 is connected to the drain of the p-channel MOS transistor 509, and the source of the n-channel MOS transistor 511 is connected to the drain of the n-channel MOS transistor 512. The gates of the p-channel MOS transistor 510 and the n-channel MOS transistor 511 are connected in common to the output of the second transfer gate 508. The drains of the p-channel MOS transistor 510 and the n-channel MOS transistor 511 are connected in common to the output terminal OUT.

In this embodiment, the p-channel MOS transistor 505 and the n-channel MOS transistor 506 that constitute the first clocked inverter, the p-channel MOS transistor and the n-channel MOS transistor that constitute the second transfer gate 508, and the p-channel MOS transistor 510 and the n-channel MOS transistor 512 that constitute the second clocked inverter are constituted from the transistors with low threshold values. The rise and fall of the threshold values of the p-channel MOS transistors correspond to the sizes of the absolute values of the threshold values.

The control signal P is activated when the semiconductor memory device is in the active state (in which the chip select signal is in the active state, for example). Then, at the time of standby, the control signal P is deactivated so as to cut off leakage caused by a transistor having a low threshold value. When the semiconductor memory device is in the active state (with the control signal P made high and the control signal /P made low), the first and second clocked inverters are made to be in an active state (on state). When the internal clock signal K is high, the second transfer gate 508 is turned on, and the second clocked inverter in the active state outputs the inverted output of the output of the first clocked inverter to the output terminal OUT. When the internal clock signal K is low, the first transfer gate 501 is turned on, and the second transfer gate 508 is turned off. The input signal IN is inverted by the inverter 502 and then supplied to the first clocked inverter. The inverters 513 and 514 are used for data retention, so that the small current driving capability of MOS transistors constituting the inverters 513 and 514 (the gate width W, or the W/L ratio, wherein L indicates the gate length) suffices.

When the control signal P is low and the control signal /P is high, the transistors 504, 507, 509, and 512 in the first and second clocked inverters are turned off, and the first and second clocked inverters are made to be in a deactivated state(off state). In the first clocked inverter, the switching transistors 504 and 507, provided between the power supply VDD and the low-threshold transistor 505 and between ground and the low-threshold transistor 506, respectively are turned off. In the second clocked inverter, the switching transistors 509 and 512, provided between the power supply VDD and the low-threshold transistor 510 and between ground and the low-threshold transistor 511 are both in an off state. Thus, leak currents caused by the low-threshold transistors 505, 506, 510, and 511 and the low-threshold transfer gate 508 are cut off.

When the control signal P is generated from the chip select signal /CS and the address valid signal /ADV, the control signal P is activated before the clock signal CLK (thus the internal clock signal K) is input (transitions). When the control signal P is activated, referring to FIG. 12A, the path corresponding to the tpd shown in FIG. 10 is constituted from the transfer gate 508, p-channel MOS transistor 510, and n-channel MOS transistor 511, and only the low-threshold voltage transistors are used for operation. Thus, the propagation delay time tpd from the rise of the internal clock signal K to transistion of the output signal of the output terminal OUT can be shortened.

As described above, in the register in this embodiment, by constituting the predetermined signal propagation path by the low-threshold transistors, the operation speed is improved. At the same time, by providing normal-threshold switching transistors in series with the low-threshold transistors in a current path into which the low-threshold transistors are inserted, an increase in power consumption is suppressed. On contrast therewith, when the current path is constituted from the low-threshold transistors alone without providing the normal-threshold switching transistors, leakage current increases and reduction in power dissipation becomes difficult, though the propagation delay time tpd is shortened.

Figure 12B:
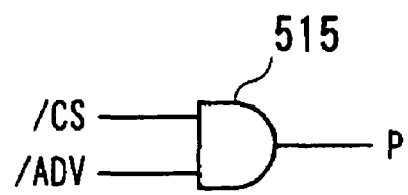
FIG. 12B is a diagram showing an example of a circuit for generating a control signal P.

FIG. 12B shows a configuration example of a control signal generation circuit for generating the control signal P. In the example shown in FIG. 12B, to a control signal generation circuit 515, the chip select signal /CS and the address valid signal /ADV, for example, are input, and the result of a logical operation on these input signals is output as the control signal P. When the control signal generation circuit 515 is constituted by a NAND gate and either of the chip select signal /CS and the address valid signal /ADV is low, the control signal P is made high (with the signal /P made low), so that the switching transistors 504, 507, 509, and 512 in FIG. 12A are all turned on, and the first and second clocked inverters are activated. On the other hand, when the chip select signal /CS and the address valid signal /ADV are both high (inactive), the control signal P is made low (with the signal /P made high), the switching transistors 504, 507, 509, and 512 in FIG. 12A are all turned off, and the first and second clocked inverters are deactivated. The signals for generating the control signal P are not limited to the chip select signal /CS and the address valid signal /ADV, or the like, and an arbitrary logical configuration of the control signal generation circuit 515 may be employed if control for turning off the clocked inverters is performed at the time of standby.

Though the foregoing description about the present invention was given in conjunction with the embodiments, the present invention is not limited to the above embodiments alone. It naturally includes various variations and modifications which could be achieved by those skilled in the art within the scope of the present invention.

The present invention avoids a delay in an active cycle due to a refresh in a semiconductor memory device in which a cell array is constituted from DRAM cells, and contributes to a high speed operation of an SRAM-interface compatible semiconductor memory device which includes the DRAM cells in the cell array. Further, the present invention contributes to reduction in power consumption and chip area by including the DRAM cells in the cell array. Further, the present invention eliminates the need for executing control over a refresh specific to the DRAM cells from the outside of the semiconductor memory device, thereby facilitating system design.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a cell array comprising a plurality of memory cells, each requiring refreshing for retention of storage data; and
a control circuit for performing control so as to delay a read/write operation in said cell array associated with a read/write request by at least one clock cycle, when the read/write request is made in a second clock cycle following a first clock cycle in which a refresh request has been made, so as to start said read/write operation in said cell array after completion of the refresh operation associated with said refresh request,
wherein the refresh operation is performed in an operation cycle longer than one clock cycle.

2. A semiconductor memory device comprising:
a cell array including a plurality of memory cells, each requiring refreshing for retention of storage data; and
a control circuit for performing control so as to stop the refreshing on determining that a read/write request is going to be made in a second clock cycle following a first clock cycle when a control signal associated with a read/write operation transitions to a predetermined value in the first clock cycle in which a refresh request has been made,
wherein the refresh operation is performed in an operation cycle longer than one clock cycle.

3. The semiconductor memory device according to claim 2, wherein the read/write operation in said cell array is started based on said read/write request in said second clock cycle.

4. The semiconductor memory device according to claim 2, further comprising:
a sample circuit, for receiving a control signal associated with the read/write operation at a control terminal thereof, and for sampling the control signal associated with the read/write operation at a transition edge of an input clock signal and outputting the sampled control signal;
a first control circuit, for receiving the control signal associated with the read/write operation input from said control terminal and the control signal associated with the read/write operation sampled by said sample circuit, and for outputting a signal for deactivating a refresh operation when at least one of the signals is in an active state;
a refresh timer for outputting a refresh request trigger signal defining a refresh interval; and
a second control circuit for generating a control signal for performing the refreshing based on the refresh request trigger signal from the refresh timer; wherein said second control circuit comprises:
a control section for performing control so that if the signal output from said first control circuit indicates deactivation of the refreshing, said control signal for performing the refreshing is not made to transition from an inactive state to an active state and maintained in the inactive state when said refresh request trigger signal in an active state is received.

5. The semiconductor memory device according to claim 4, wherein the control signal associated with the read/write operation includes:
an address valid signal indicating that an address signal for the read/write operation is valid; and
a chip select signal indicating presence or absence of chip selection; and
wherein said second control circuit comprises a circuit for performing control so as to deactivate the control signal for performing the refreshing if the address valid signal and the chip select signal are both in active states when the refresh request trigger signal in the active state is received.

6. A semiconductor memory device comprising:
a cell array including a plurality of memory cells, each requiring refreshing for retention of storage data; and
a control circuit for performing control so as to reduce a time interval for exercising refreshing, when a read/write request is made in a second clock cycle following a first clock cycle in which a refresh request has been made, thereby to bring a refreshing operation associated with said refresh request to completion, and to start a read/write operation in said cell array associated with said read/write request,
wherein exercising refreshing is performed in an operation cycle longer than one clock cycle.

7. The semiconductor memory device according to claim 6, further comprising a circuit for performing control so that a word line for the refreshing is set from a selected state to a nonselected state at a predetermined transition edge of a clock signal defining said second clock cycle.

8. The semiconductor memory device according to claim 6, further comprising a refresh timer for outputting a refresh request trigger signal defining a refresh interval; wherein after the time interval for performing the refreshing is reduced, an output period of the refresh request trigger signal from the refresh timer is reduced.

9. A semiconductor memory device comprising:
a cell array comprising a plurality of memory cells, each requiring refreshing for retention of storage data;
a refresh timer for outputting a refresh request trigger signal defining a refresh interval;
a sample circuit, for receiving a control signal associated with a read/write operation, and for sampling the control signal at a transition edge of an input clock signal;
a first control circuit, for receiving as input signals the control signal and an output signal from said sample circuit, and for outputting an output signal in an active state when at least one of its two input signals is in an active state;
a first flip-flop, for receiving the output signal of said first control circuit and having an output thereof set to a first logic value when the output signal of said first control circuit transitions to the active state;
a first register for sampling the output signal of said first flip-flop at the transition edge of the input clock signal;
a first pulse generation circuit, for receiving an output signal of said first register, for outputting a pulse signal, defining a selection period of a word line for a read/write operation, based on transition of the output signal of said first register;

a second flip-flop having an output thereof set to a first logic value upon receipt of a refresh request trigger signal from said refresh timer;

a second pulse generation circuit, for receiving the output of said second flip-flop, and for outputting a pulse signal based on transition of the output of said second flip-flop to the first logic value;

a second control circuit, for receiving the pulse signal from said second pulse generation circuit and the output signal of said first register, for outputting a pulse signal defining a selection period of a word line for the refreshing; and a third control circuit provided between an output terminal of said second flip-flop and an input terminal of said second pulse generation circuit, wherein said third control circuit performs control so that, based on the output of said first flip-flop, said third control circuit changes an output signal thereof according to the output of said second flip-flop, when the control signal associated with the read/write operation has a value indicating an inactive state, and deactivates said second pulse generation circuit, when the control signal associated with the read/write operation has a value indicating the active state.

10. A semiconductor memory device comprising:
a cell array comprising a plurality of memory cells, each requiring refreshing for retention of storage data;
a refresh timer for outputting a refresh request trigger signal defining a refresh interval;
a sample circuit, for receiving a control signal associated with a read/write operation, and for sampling the control signal at a transition edge of an input clock signal;
a first control circuit, for receiving as input signals the control signal and an output signal from said sample circuit, and for outputting an output signal in an active state when at least one of its two input signals is in an active state;
a first flip-flop, for receiving the output signal of said first control circuit, and having an output thereof set to a first logic value when the output signal of said first control circuit transitions to the active state;
a first register for sampling the output signal of said first flip-flop at the transition edge of the input clock signal;
a first pulse generation circuit, for receiving an output signal of said first register, and for outputting a pulse signal defining a selection period of a word line for a read/write operation, based on transition of said output signal of said first register;
a second flip-flop having an output thereof set to the first logic value upon receipt of a refresh request trigger signal from said refresh timer;
a second pulse generation circuit, for receiving the output of said second flip-flop, and for outputting a pulse signal based on transition of the output of said second flip-flop to the first logic value;
a second control circuit, for receiving a pulse signal from said second pulse generation circuit and the output signal of said first register, and for outputting a pulse signal defining a selection period of a word line; and
a circuit for stopping supply of the clock signal to said first register during a refresh operation; wherein
when a read/write request is made in a clock cycle subsequent to a clock cycle in which the refresh request trigger from said refresh timer is received, the read/write operation is performed, being delayed by at least one clock cycle.

11. A semiconductor memory device comprising:
a cell array comprising a plurality of memory cells, each requiring refreshing for retention of storage data;
a refresh tinier for outputting a refresh request trigger signal defining a refresh interval;
a sample circuit, for receiving a control signal associated with a read/write operation, and for sampling the control signal at a transition edge of an input clock signal;
a first control circuit, for receiving as input signals the control signal and an output signal from said sample circuit, and for outputting an output signal in an active state when at least one of its two input signals is in an active state;
a first flip-flop, for receiving the output signal of said first control circuit, and having an output thereof set to a first logic value when the output signal of said first control circuit transitions to the active state;
a first register for sampling the output signal of said first flip-flop at the transition edge of the input clock signal;
a first pulse generation circuit for outputting a pulse signal defining a selection period of a word line for a read/write operation, based on transition of a signal input thereto;
a second flip-flop having an output thereof set to the first logic value upon receipt of a refresh request trigger signal from said refresh timer;
a second pulse generation circuit, for receiving the output of said second flip-flop, for outputting a pulse signal based on transition of the output of said second flip-flop to the first logic value;
a second control circuit, for receiving the pulse signal from said second pulse generation circuit and an output signal of said first register, and for outputting a pulse signal defining a selection period of a word line for the refreshing;
a second register for sampling the output of said first register using the input clock signal; and
a selector, for receiving the output of said first register and an output of said second register, selecting the output of said second register for a refresh cycle, selecting the output of said first register for a cycle other than the refresh cycle, and supplying an output of said selector to said first pulse generation circuit.

12. A semiconductor memory device comprising:
a cell array comprising a plurality of memory cells, each requiring refreshing for retention of storage data;
a refresh timer for outputting a refresh request trigger signal defining a refresh interval;
a sample circuit, for receiving a control signal associated with a read/write operation, and for sampling the control signal at a transition edge of an input clock signal;
a first control circuit, for receiving as input signals the control signal and an output signal from said sample circuit, and for outputting an output signal in an active state when at least one of its two input signals is in an active state;
a first flip-flop, for receiving the output signal of said first control circuit, and having an output thereof set to a first logic value when the output signal of said first control circuit transitions to the active state;
a first register for sampling the output signal of said first flip-flop at the transition edge of the input clock signal;
a first pulse generation circuit, for receiving an output signal from said first register, and for outputting a pulse signal defining a selection period of a word line for a read/write operation, based on transition of the output signal from said first register;

a second flip-flop having an output thereof set to the first logic value upon receipt of a refresh request trigger signal from said refresh timer;

a second pulse generation circuit, for receiving the output of said second flip-flop, and for outputting a pulse signal based on transition of the output of said second flip-flop to the first logic value;

a second control circuit, for receiving the pulse signal from said second pulse generation circuit and the output signal from said first register, and for outputting a pulse signal based on the received signals; and a third control circuit having an output thereof set upon receipt of the pulse signal from said second control circuit and having the output thereof reset when the output signal from said first register transitions to a value, for causing said first pulse generation circuit to generate its pulse signal, said third control circuit outputting a pulse signal defining a selection period of a word line for the refreshing from an output terminal thereof.

13. The semiconductor memory device according to claim 9, further comprising:
a third pulse generation circuit, for receiving the output signal from said first register, and for outputting a pulse signal based on transition of the output signal from said first register; wherein:
the outputs of said first and second flip-flops are reset based on the pulse signal from said third pulse generation circuit.

14. The semiconductor memory device according to claim 10, further comprising:
a third pulse generation circuit, for receiving the output signal from said first register, and for outputting a pulse signal based on transition of the output signal from said first register; wherein:
the outputs of said first and second flip-flops are reset based on the pulse signal from said third pulse generation circuit.

15. The semiconductor memory device according to claim 12, further comprising:
a third pulse generation circuit, for receiving the output signal from said first register, and for outputting a pulse signal based on transition of the output signal from said first register; wherein:
the outputs of said first and second flip-flops are reset based on the pulse signal from said third pulse generation circuit.

16. The semiconductor memory device according to claim 11, further comprising:
a third pulse generation circuit, for receiving the output signal from said first register, and for outputting a pulse signal based on transition of the output signal from said first register; wherein:
the outputs of said first and second flip-flops are reset based on the pulse signal from said third pulse generation circuit.

17. The semiconductor memory device according to claim 9, wherein:
said sample circuit comprises:
a second register for sampling the control signal indicating that an address signal for the read/write input from a first control terminal thereof is valid at the transition edge of the input clock signal; and a third register for sampling a chip select signal indicating presence or absence of a chip selection input from a second control terminal thereof at the transition edge of the input clock signal; and said first control circuit comprises:
a first logic circuit, for receiving as input signals an output signal sampled by said third register and the control signal from said first control terminal, and for outputting the output signal in the active state when at least one of its two input signals is in the active state;
a second logic circuit, for receiving as input signals the output signal sampled by said second register and the chip select signal from said second control terminal, and for outputting an output signal in the active state when at least one of its two input signals is in the active state; and
a third pulse generation circuit, for receiving as input signals the two output signals from said first and second logic circuits, and for outputting a pulse signal when its two input signals transition to the active states.

18. The semiconductor memory device according to claim 10, wherein:
said sample circuit comprises:
a second register for sampling the control signal indicating that an address signal for the read/write input from a first control terminal thereof is valid at the transition edge of the input clock signal; and
a third register for sampling a chip select signal indicating presence or absence of a chip selection input from a second control terminal thereof at the transition edge of the input clock signal; and said first control circuit comprises:
a first logic circuit, for receiving as input signals an output signal sampled by said third register and the control signal from said first control terminal, and for outputting the output signal in the active state when at least one of its two input signals is in the active state;
a second logic circuit, for receiving as input signals the output signal sampled by said second register and the chip select signal from said second control terminal, and for outputting an output signal in the active state when at least one of its two input signals is in the active state; and
a third pulse generation circuit, for receiving as input signals the two output signals from said first and second logic circuits, and for outputting a pulse signal when its two input signals transition to the active states.

19. The semiconductor memory device according to claim 11, wherein:
said sample circuit comprises:
a third register for sampling the control signal indicating that an address signal for the read/write input from a first control terminal thereof is valid at the transition edge of the input clock signal; and
a fourth register for sampling a chip select signal indicating presence or absence of a chip selection input from a second control terminal thereof at the transition edge of the input clock signal; and said first control circuit comprises:
a first logic circuit, for receiving as input signals an output signal sampled by said third register and the control signal from said first control terminal, and for outputting the output signal in the active slate when at least one of its two input signals is in the active state;

a second logic circuit, for receiving as input signals the output signal sampled by said second register and the chip select signal from said second control terminal, and for outputting an output signal in the active state when at least one of its two input signals is in the active state; and a third pulse generation circuit, for receiving as input signals the two output signals from said first and second logic circuits, and for outputting a pulse signal when its two input signals transition to the active states.

20. The semiconductor memory device according to claim 12, wherein:

said sample circuit comprises:

a second register for sampling the control signal indicating that an address signal for the read/write input from a first control terminal thereof is valid at the transition edge of the input clock signal; and a third register for sampling a chip select signal indicating presence or absence of a chip selection input from a second control terminal thereof at the transition edge of the input clock signal; and said first control circuit comprises:

a first logic circuit, for receiving as input signals an output signal sampled by said third register and the control signal from said first control terminal, and for outputting the output signal in the active state when at least one of its two input signals is in the active state;

a second logic circuit, for receiving as input signals the output signal sampled by said second register and the chip select signal from said second control terminal, and for outputting an output signal in the active state when at least one of its two input signals is in the active state; and a third pulse generation circuit, for receiving as input signals the two output signals from said first and second logic circuits, and for outputting a pulse signal when its two input signals transition to the active states.

21. The semiconductor memory device according to claim 9, further comprising an inverter, for receiving as an input signal the output of said first flip-flop, inverting its input signal, and outputting the inverted input signal;

wherein the output of said inverter is supplied to said first register and said third control circuit.

22. The semiconductor memory device according to claim 9, further comprising:

a delay circuit for delaying the output of said first register;

wherein an output of said delay circuit is supplied to said second control circuit and said second pulse generation circuit.

23. The semiconductor memory device according to claim 10, further comprising:

a delay circuit for delaying the output of said first register;

wherein an output of said delay circuit is supplied to said second control circuit and said second pulse generation circuit.

24. The semiconductor memory device according to claim 12, further comprising:

a delay circuit for delaying the output of said first register;

wherein an output of said delay circuit is supplied to said second control circuit and said second pulse generation circuit.

25. The semiconductor memory device according to claim 11, further comprising:

a delay circuit for delaying the output of said selector;

wherein an output of said delay circuit is supplied to said second control circuit and said second pulse generation circuit.

26. The semiconductor memory device according to claim 9, further comprising:

a circuit for generating a trigger signal based on the refresh request trigger signal from said refresh timer;

wherein:

the output of said second flip-flop is set to the first logic value, upon receipt of the trigger signal from said trigger circuit.

27. The semiconductor memory device according to claim 10, further comprising:

a circuit for generating a trigger signal based on the refresh request trigger signal from said refresh timer;

wherein:

the output of said second flip-flop is set to the first logic value, upon receipt of the trigger signal from said trigger circuit.

28. The semiconductor memory device according to claim 11, further comprising:

a circuit for generating a trigger signal based on the refresh request trigger signal from said refresh timer;

wherein:

the output of said second flip-flop is set to the first logic value, upon receipt of the trigger signal from said trigger circuit.

29. The semiconductor memory device according to claim 12, further comprising:

a circuit for generating a trigger signal based on the refresh request trigger signal from said refresh timer;

wherein:

the output of said second flip-flop is set to the first logic value, upon receipt of the trigger signal from said trigger circuit.

30. A semiconductor memory device, comprising:

a cell array comprising a plurality of memory cells, each requiring refreshing for retention of storage data;

a control circuit for performing control so as to delay a read/write operation in said cell array associated with a read/write request by at least one clock cycle, when the read/write request is made in a second clock cycle following a first clock cycle in which a refresh request has been made, so as to start said read/write operation in said cell array after completion of the refresh operation associated with said refresh request; and a plurality of registers, for sampling an input signal based on the input clock signal;

wherein each of said registers comprises, between a signal input terminal thereof and a signal output terminal thereof:

a first transfer gate controlled to be on or off according to the input clock signal;

a first flip-flop, comprising two inverters with inputs thereof and outputs thereof mutually connected;

a second transfer gate controlled to be on or off according to the input clock signal, being complementary with said first transfer gate;

a second flip-flop, comprising two inverters with inputs thereof and outputs thereof mutually connected;

a first clocked inverter provided between the output of said first flip-flop and said second transfer gate, for being controlled to be on or off according to a control signal; and a second clocked inverter provided between said second transfer gate and said signal output terminal, for being controlled to be on or off according to the control signal;

each of said first and second clocked inverters comprises a first switching transistor, two complementary transistors, and a second switching transistor connected in series between a first power supply and a second power supply; said first switching transistor being turned on or off according to the control signal, said two complementary transistors constituting an inverter for inverting an input signal, and a second switching transistor being turned on or off according to the control signal;

in each of said first and second clocked inverters, said two complementary transistors have relatively low threshold values, and said first and second switching transistors have threshold values higher than said low threshold values; and transistors constituting said first and second transfer gates have relatively low threshold values.

31. The semiconductor memory device according to claim 30, wherein said register for sampling the input signal comprise said latch circuits.

32. The semiconductor memory device according to claim 30, wherein an address register for sampling an input address signal using the clock signal comprises said registers.

33. The semiconductor memory device according to claim 30, wherein the control signal is deactivated at a time of standby of said semiconductor memory device, and activated at a time of activation of said semiconductor memory device.

34. The semiconductor memory device according to claim 30, wherein the control signal is deactivated at a time of standby of said semiconductor memory device, and activated at a time of activation of said semiconductor memory device.

35. The semiconductor memory device according to claim 1, wherein said semiconductor memory device is interface compatible with a synchronous type static random access memory.

* * * * *